(12) United States Patent
Jin et al.

(10) Patent No.: US 7,371,696 B2
(45) Date of Patent: May 13, 2008

(54) CARBON NANOTUBE STRUCTURE AND METHOD OF VERTICALLY ALIGNING CARBON NANOTUBES

(75) Inventors: Yong-Wan Jin, Seoul (KR); Jong-Min Kim, Suwon-si (KR); Hee-Tae Jung, Daejeon-si (KR); Tae-Won Jeong, Seoul (KR); Young-Koan Ko, Daejeon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/455,192

(22) Filed: Jun. 19, 2006

(65) Prior Publication Data

US 2007/0082426 A1 Apr. 12, 2007

(30) Foreign Application Priority Data

Oct. 11, 2005 (KR) ............... 10-2005-0095497

(51) Int. Cl.
*H01L 21/31* (2006.01)
*H01L 21/469* (2006.01)

(52) U.S. Cl. ......... 438/758; 257/E51.04; 257/E51.039; 257/E23.074; 438/82; 438/99; 977/700; 977/742; 977/788; 977/842

(58) Field of Classification Search ............... 438/758
See application file for complete search history.

(56) References Cited

U.S. PATENT DOCUMENTS

| | | | |
|---|---|---|---|
| 2003/0143398 A1* | 7/2003 | Ohki et al. | 428/398 |
| 2004/0150100 A1* | 8/2004 | Dubin et al. | 257/720 |
| 2005/0282925 A1* | 12/2005 | Schlenoff et al. | 523/106 |
| 2007/0048181 A1* | 3/2007 | Chang et al. | 422/57 |

* cited by examiner

*Primary Examiner*—Walter Lindsay, Jr.
*Assistant Examiner*—Abdulfattah Mustapha
(74) *Attorney, Agent, or Firm*—Robert E. Bushnell, Esq.

(57) ABSTRACT

A Carbon NanoTube (CNT) structure includes a substrate, a CNT support layer, and a plurality of CNTs. The CNT support layer is stacked on the substrate and has pores therein. One end of each of the CNTs is attached to portions of the substrate exposed through the pores and each of the CNTs has its lateral sides supported by the CNT support layer. A method of vertically aligning CNTs includes: forming a first conductive substrate; stacking a CNT support layer having pores on the first conductive substrate; and attaching one end of the each of the CNTs to portions of the first conductive substrate exposed through the pores.

10 Claims, 5 Drawing Sheets

CARBON NANOTUBE STRUCTURE AND METHOD OF VERTICALLY ALIGNING CARBON NANOTUBES

CLAIM OF PRIORITY

This application makes reference to, incorporates the same herein, and claims all benefits accruing under 35 U.S.C. §119 from an application for CARBON NANOTUBES STRUCTURE AND VERTICAL ALIGNMENT METHOD OF THE CARBON NANOTUBES earlier filed in the Korean Intellectual Property Office on the 11$^{th}$ Oct. 2005 and there duly assigned Ser. No. 10-2005-0095497.

BACKGROUND OF THE INVENTION

1. Field of the Invention

The present invention relates to a Carbon NanoTube (CNT) structure and a method of manufacturing CNTs, and more particularly, to a CNT structure having CNTs vertically aligned on a substrate and a method of vertically aligning the CNTs.

2. Description of the Related Art

Since the unique structural and electrical characteristics of CNTs were known, CNTs have been used for a variety of devices such as Field Emission Devices (FEDs), back-lights for Liquid Crystal Displays (LCDs), nanoelectronic devices, actuators and batteries.

FEDs are devices that emit light by emitting electrons from an electron emitting source formed on a cathode and by allowing the electrons to collide with and excite a phosphor layer coated on an anode. Recently, CNTs having excellent electron emitting characteristics have been used as electron emitting sources of FEDs. To manufacture an improved FED, the CNTs used for the electron emitting source should have a low driving voltage and a high emission current. For that purpose, the CNTs need to be vertically aligned on the cathode.

Methods of aligning CNTs can be divided into a direct growth-aligning method and an after-growth-aligning method. The direct growth-aligning method can realize a high density nano structure where CNTs are aligned very well by Chemical Vapor Deposition (CVD), but has a disadvantage in needing high temperature processing, so that the direct-growth aligning method has great limitations in applications to electronic devices that use the CNTs.

The after-growth-aligning method includes a method of stacking CNTs through chemical modification of a substrate surface and a method of aligning CNTs using an electric field or a magnetic field. A method has been studied to characterize the surface of a substrate using a variety of lithography processes and selectively arrange CNTs thereon. However, the after-growth-aligning method has difficulty in vertically aligning the CNTs on the substrate. Recently, there has been research with regard to vertically aligning the CNTs on the substrate using chemical bonding through chemical modification of the substrate and the CNTs. However, it has been known that these methods of aligning the CNTs have lots of problems due to the high aspect ratios of the CNTs.

SUMMARY OF THE INVENTION

The present invention provides a Carbon NanoTube (CNT) structure having CNTs vertically aligned on a substrate and a method of vertically aligning the CNTs.

According to one aspect of the present invention, a CNT structure is provided including: a substrate; a CNT support layer stacked on the substrate and having a plurality of pores arranged therein; and a plurality of CNTs, one end of each of the CNTs being attached to portions of the substrate exposed through the plurality of pores and lateral sides of each of the CNTs being supported by the CNT support layer.

A Self-Assembled Monolayer (SAM) including a functional group having a chemical affinity for the plurality of CNTs is preferably arranged on the surface of the substrate, and one end of each of the CNTs is preferably attached to the SAM through the plurality of pores.

The SAM preferably includes an organic material containing phosphorous. The organic material containing phosphorous preferably includes 2-carboxyethyl phosphoric acid.

The CNT support layer preferably includes a colloid monolayer including a plurality of self-assembled colloid particles and the plurality of pores are arranged between the colloid particles. The colloid particles preferably include either silica or polystyrene.

The substrate preferably includes a conductive material. The conductive material preferably includes Indium Tin Oxide (ITO).

According to another aspect of the present invention, a method of vertically aligning Carbon NanoTubes (CNTs) is provided, the method including: forming a first conductive substrate; stacking a CNT support layer having a plurality of pores on the first conductive substrate; and attaching one end of the each of the CNTs to portions of the first conductive substrate exposed through plurality of pores.

The method preferably further includes forming a Self-Assembled Monolayer (SAM) including a functional group having a chemical affinity for the plurality of CNTs on the surface of the first conductive substrate after its formation. The SAM is preferably formed of an organic material containing phosphorous. The organic material containing phosphorous preferably includes 2-carboxyethyl phosphoric acid.

Stacking of the CNT support layer preferably includes forming a colloid monolayer including a plurality of self-assembled colloid particles on the SAM, and forming the plurality of pores between the colloid particles. The colloid particles are preferably formed of either silica or polystyrene.

Attaching one end of each of the CNTs preferably includes: arranging a second conductive substrate spaced a predetermined distance from a surface of the first conductive substrate on which the colloid monolayer has been formed; injecting a dispersion solution to disperse the CNTs between the first and second conductive substrates; attaching one end of each of the CNTs contained in the dispersion solution to the SAM using the plurality of pores formed between the colloid particles by applying an electric field between the first conductive substrate and the second conductive substrate; and removing the dispersion solution with a solvent.

An anode voltage and a cathode voltage are preferably respectively supplied to the first conductive substrate and the second conductive substrate to produce the electric field.

BRIEF DESCRIPTION OF THE DRAWINGS

A more complete appreciation of the present invention and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Figure 1:
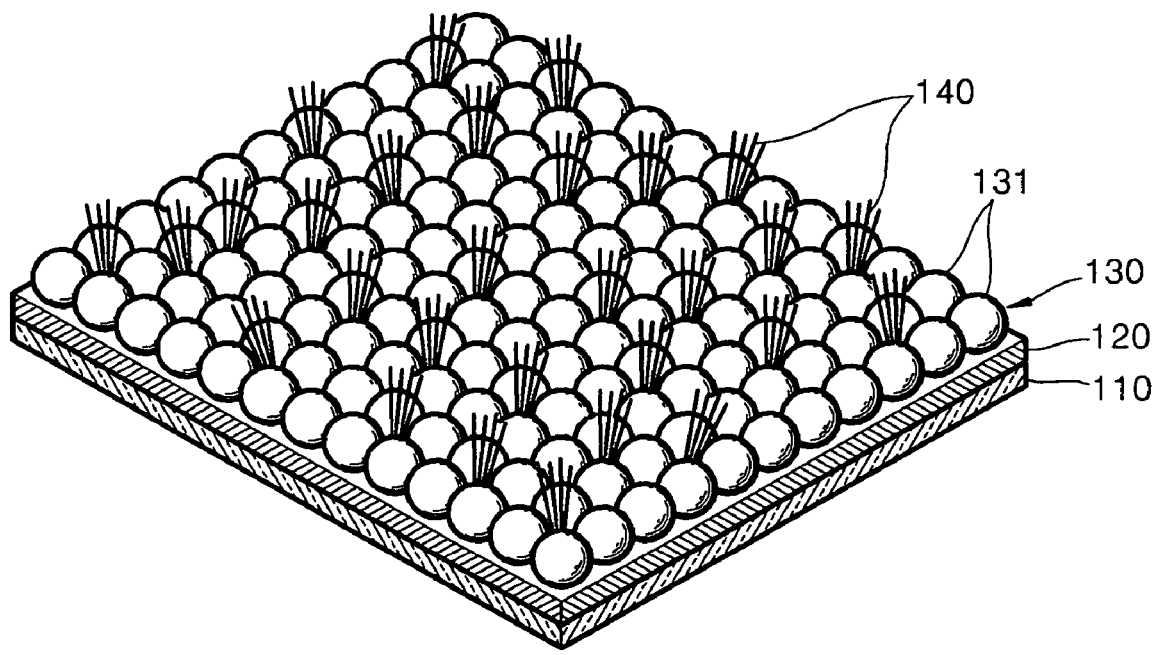
FIG. 1 is a view of a Carbon NanoTube (CNT) structure according to an embodiment of the present invention.

The present invention is described more fully below with reference to the accompanying drawings, in which exemplary embodiments of the present invention are shown. Like reference numerals in the drawings denote like elements. The invention can, however, be embodied in many different forms and should not be construed as being limited to the embodiments set forth herein. Rather, these embodiments are provided so that this disclosure will be thorough and complete, and will fully convey the concept of the present invention to those skilled in the art.

FIG. 1 is a perspective view of a Carbon NanoTube (CNT) structure according to an embodiment of the present invention.

Referring to FIG. 1, a predetermined material layer is formed on the surface of a substrate 110 so that one end of each of the CNTs 140 can be attached well thereon. The substrate 110 can be formed of a conductive material, such as Indium Tin Oxide (ITO). According to an embodiment of the present invention, the material layer can be a Self-Assembled Monolayer (SAM) 120 including a function group having affinity for the CNTs 140. The SAM 120 can be formed of an organic material containing phosphorous, such as 2-carboxyethyl phosphoric acid.

A CNT support layer is formed on the SAM 120. The CNT support layer includes a plurality of pores exposing the SAM 120. According to an embodiment of the present invention, the CNT support layer can be a colloid monolayer 130 formed on the SAM 120. The colloid monolayer 130 includes a plurality of self-assembled colloid particles 131. Also, the pores exposing the SAM 120 are formed between the colloid particles 131. The colloid particles 131 can be formed of silica or polystyrene.

One end of each of the CNTs 140 are attached on the portions of the SAM 120 exposed through the pores formed between the colloid particles 131. Since the lateral sides of the CNTs 140 having large aspect ratios are supported by the colloid particles 131, the CNTs 140 can be vertically aligned on the substrate 110 having the SAM 120 thereon with the help of the pores formed between the colloid particles 131.

Though the SAM 120 including a functional group having affinity for the CNTs 140 is formed on the surface of the substrate 110 in the present embodiment, the SAM cannot be formed but one end of each of the CNTs 140 can be directly attached to the portions of the substrates 110 exposed through the pores between the colloid particles. Also, though the colloid monolayer 130 including a plurality of colloid particles 131 is used for a CNT support layer in the present invention, a predetermined material layer having a plurality of pores therein can be used.

A method of vertically aligning the CNTs so as to manufacture the CNT structure is described below. FIGS. 2A through 2D are views of the method of vertically aligning the CNTs so as to manufacture the CNT structure.

Figure 2A:
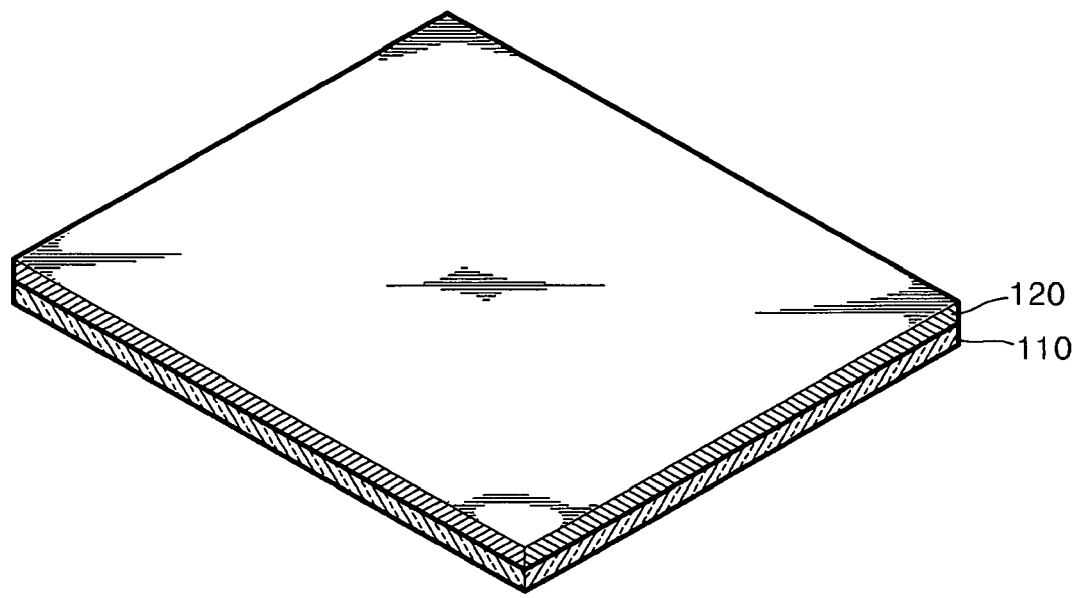
FIGS. 2A through 2D are views of a method of vertically aligning CNTs so as to manufacture the CNT structure of FIG. 1.

Referring to FIG. 2A, a first conductive substrate 110 is provided. The first conductive substrate 110 can be the substrate described in the above embodiment. The first conductive substrate 110 can be formed of a transparent conductive material, such as ITO. Also, a SAM 120 including a function group having affinity for the CNTs (140 in FIG. 2D) is formed on the first conductive substrate 110. The SAM 120 can be formed of an organic material containing phosphorous, such as 2-carboxyethyl phosphoric acid. In detail, the SAM 120 can be formed by making 5 mM of 2-carboxyethyl phosphoric acid and immersing the first conductive substrate 110 in this solution for a predetermined period of time.

Figure 2B:
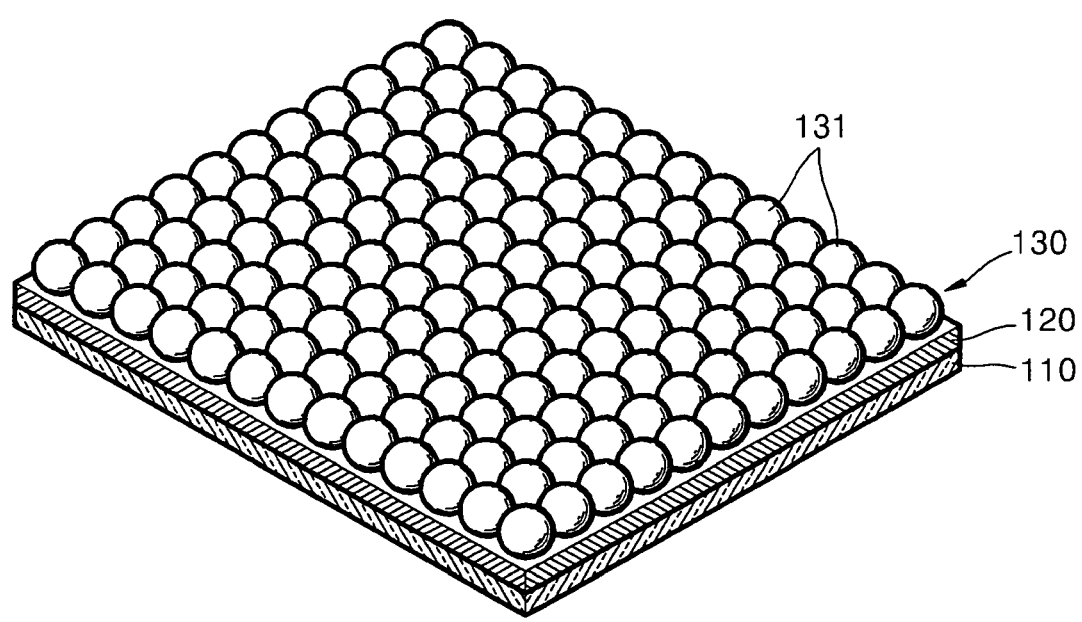
Figure 3:
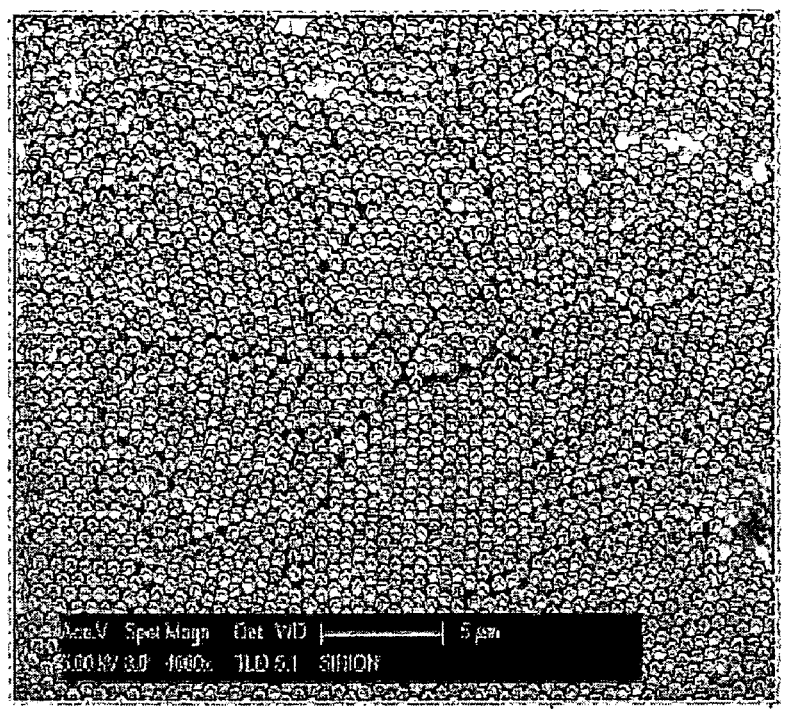
FIG. 3 is a Scanning Electron Microscope (SEM) photo of a colloid monolayer formed on a Self-Assembled Monolayer (SAM)

Referring to FIG. 2B, a CNT support layer having a plurality of pores therein is formed on the SAM 120. According to an embodiment of the present invention, the CNT support layer can be a colloid monolayer 130 formed on the SAM 120. The colloid monolayer 130 includes a plurality of self-assembled colloid particles 131. Also, the pores exposing the SAM 120 are formed between the colloid particles 131. The colloid particles 131 can be formed of silica or polystyrene. In detail, silica particles having uniform nano sizes of about 570 nm are dispersed in a propanol solution and then this solution is spin-coated on the first conductive substrate 110 on which the SAM 120 is formed, so that the colloid monolayer 130 including a plurality of self-assembled colloid particles 131 can be formed on the SAM 120. A Scanning Electron Microscope (SEM) photo in FIG. 3 shows the colloid monolayer 130 formed on the SAM 120.

Figure 2C:
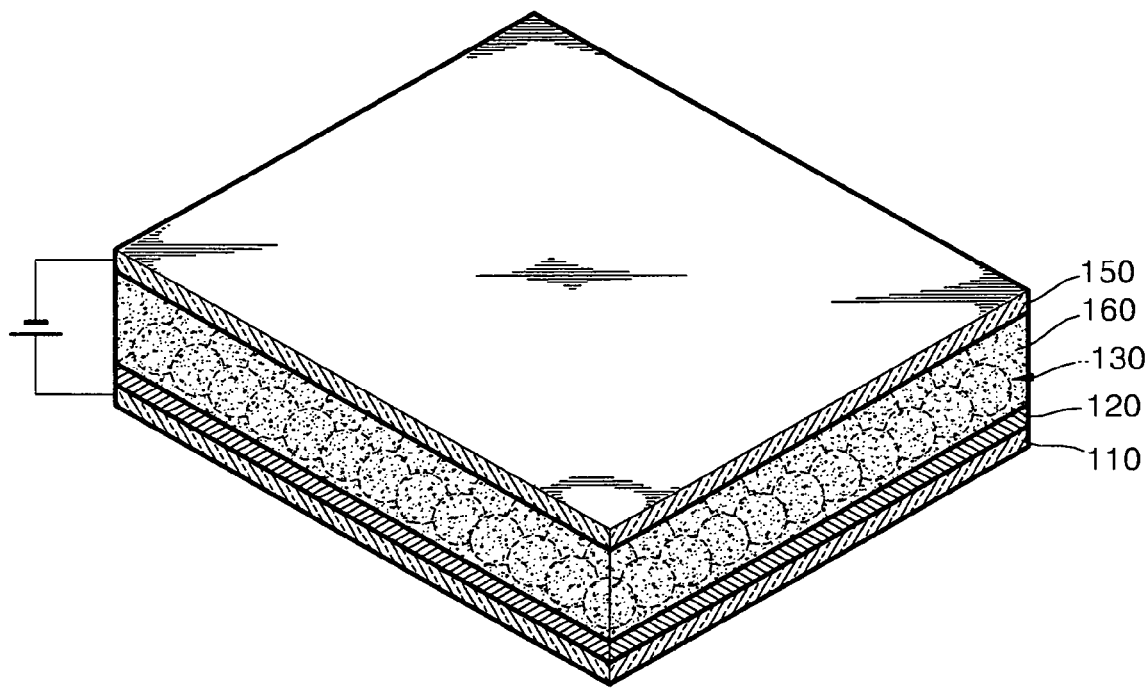

Referring to FIG. 2C, a second conductive substrate 150 is arranged to be spaced a predetermined distance from the first conductive substrate 110 on which the colloid monolayer 130 is formed. The second conductive substrate 150 can be formed of a transparent conductive material, such as ITO. Also, a dispersion solution 160 dispersing the CNTs (140 in FIG. 2) therein is injected between the first conductive substrate 110 and the second conductive substrate 150. When the first and second conductive substrates 110 and 150 are spaced a small distance, e.g., 1-1.5 mm from each other, the dispersion solution 160 can be injected between the first conductive substrate 110 and the second conductive substrate 150 by capillary action.

Subsequently, when a predetermined anode voltage and cathode voltage are respectively supplied to the first conductive substrate 110 and the second conductive substrate 150, an electric field is generated between the first conductive substrate 110 and the second conductive substrate 150. Also, one end of each of the CNTs 140 contained in the dispersion solution 160 are attached to the portions of the SAM 120 exposed through the pores formed between the colloid particles 131 by the electric field. At this point, since the SAM 120 includes a function group having affinity for the CNTs 140, one end of each of the CNTs 140 are stably attached to the SAM 120 by chemical bonding. Also, the lateral sides of the CNTs 140 having large aspect ratios are supported by the colloid particles 131, so that the CNTs 140 can be vertically aligned on the substrate 110 having the SAM thereon.

Figure 2D:
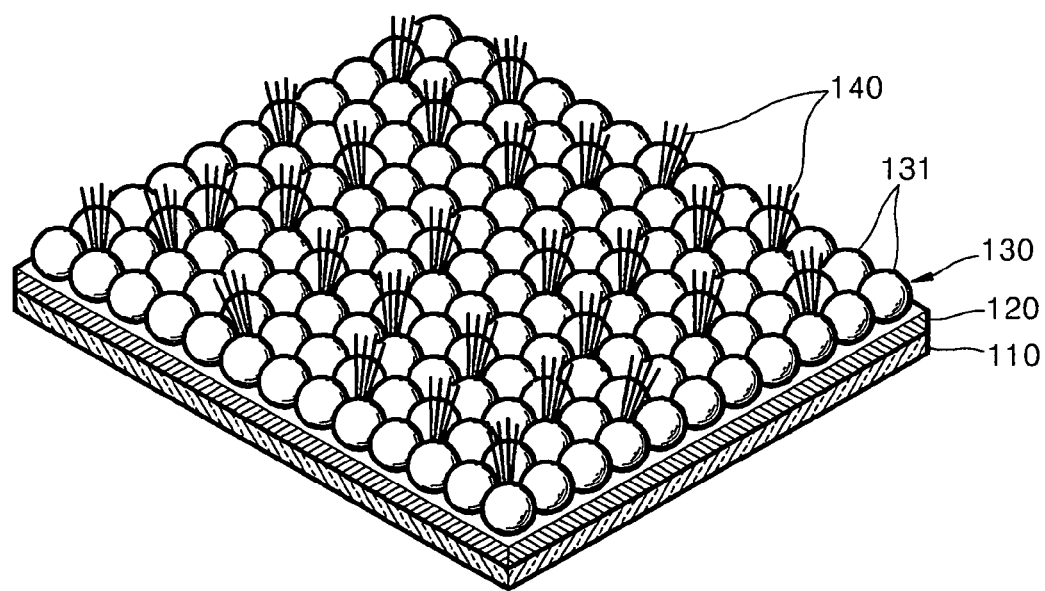
Figure 4:
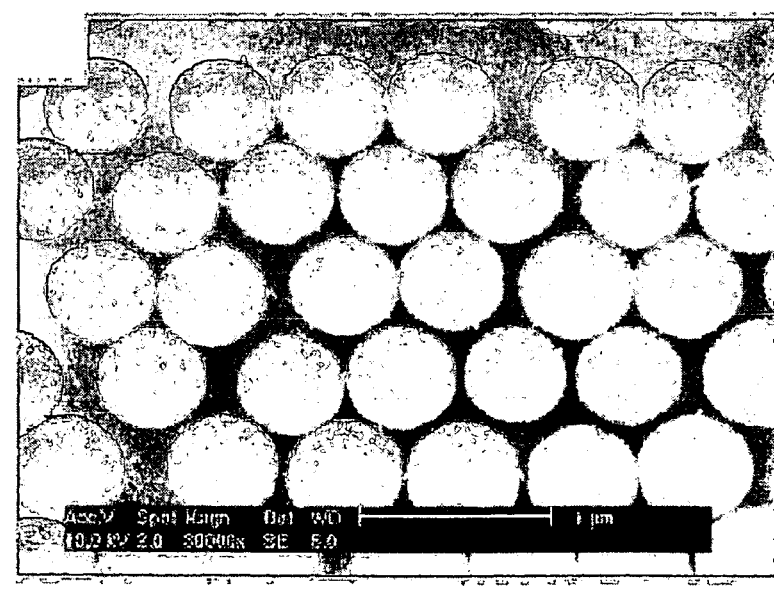
FIG. 4 is an SEM photo of vertically aligned CNTs arranged between colloid particles.

Lastly, when the dispersion solution 160 and the second conductive substrate 150 are removed, the CNTs 140 remain vertically aligned through the pores on the substrate 110 having the colloid monolayer 130 thereon as illustrated in FIG. 2D. FIG. 4 is an SEM photo showing CNTs 140 which are vertically aligned between colloid particles 131.

According to the inventive method for vertically aligning the CNTs, one end of each of the CNTs 140 having large aspect ratios are attached to the substrate 110 through the pores between the colloid particles 131 and the lateral sides of the CNTs 140 are supported by the colloid particles 131, so that the CNTs 140 can be vertically aligned at predetermined positions on the substrate 110.

The CNT structure manufactured by the method of vertically aligning the CNTs according to an embodiment of the present invention can be applied to a variety of electronic devices, and in particular, usefully applied to an electron emitting source of an FED.

Figure 5:
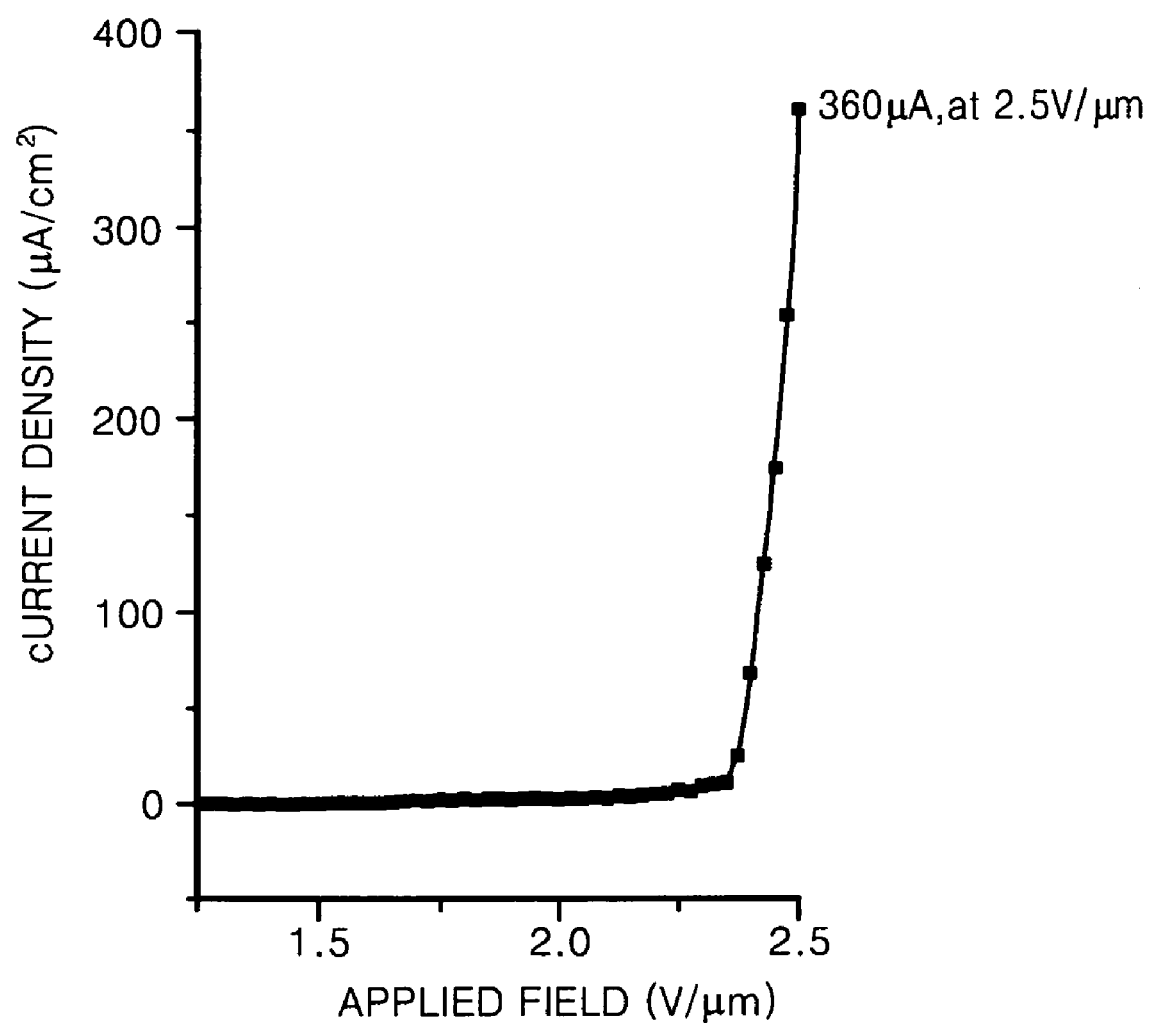
FIG. 5 is a view of the electric field emission characteristics of an Field Emission Device (FED) having a CNT structure according to an embodiment of the present invention.

FIG. 5 illustrates results obtained by measuring the electric field emission characteristics of an FED that uses the CNT structure according to an embodiment of the present invention. Referring to FIG. 5, it is revealed that a current density required for the FED can be obtained by properly changing the intensity of an electric field applied between a cathode and an anode.

As described above, the present invention has the following effects.

First, a colloid monolayer including a plurality of colloid parties is formed on the substrate, so that one end of each of the CNTs 140 having large aspect ratios are attached to the substrate 110 through the pores formed between the colloid particles 131 and the lateral sides of the CNTs 140 are supported by the colloid particles 131. Therefore, the CNTs 140 can be vertically aligned at predetermined positions on the substrate 110.

Second, the method of vertically aligning the CNTs according to an embodiment of the present invention can vertically align the CNTs using a simple process that can be applied to the manufacture of a large-sized FED. Also, since the method does not require a high temperature process, the present invention has a small limitation for temperature.

Third, the CNTs can be vertically aligned on the substrate using a small amount of CNTs. In detail, according to the inventive method of vertically aligning the CNTs, an amount of about 0.2 µg of CNTs is required for vertically aligning the CNTs on an area 1 cm$^2$ of the substrate. Therefore, it is possible to manufacture a 40-inch FED using only 1 mg of CNTs.

While the present invention has been particularly shown and described with reference to exemplary embodiments thereof, it will be understood by those of ordinary skill in the art that various modifications in form and detail can be made therein without departing from the spirit and scope of the present invention as defined by the following claims.

What is claimed is:

1. A method of vertically aligning Carbon NanoTubes (CNTs), the method comprising:
    forming a first conductive substrate;
    stacking a CNT support layer having a plurality of pores on the first conductive substrate;
    attaching one end of the each of the CNTs to portions of the first conductive substrate exposed through plurality of pores; and
    forming a Self-Assembled Monolayer (SAM) including a functional group having a chemical affinity for the plurality of CNTs on the surface of the first conductive substrate after its formation.

2. The method of claim 1, wherein the SAM is formed of an organic material containing phosphorous.

3. The method of claim 2, wherein the organic material containing phosphorous comprises 2-carboxyethyl phosphoric acid.

4. The method of claim 3, wherein stacking of the CNT support layer comprises forming a colloid monolayer including a plurality of self-assembled colloid particles on the SAM, and forming the plurality of pores between the colloid particles.

5. The method of claim 4, wherein the colloid particles are formed of either silica or polystyrene.

6. The method of claim 4, wherein attaching one end of each of the CNTs comprises:
    arranging a second conductive substrate spaced a predetermined distance from a surface of the first conductive substrate on which the colloid monolayer has been formed;
    injecting a dispersion solution to disperse the CNTs between the first and second conductive substrates;
    attaching one end of each of the CNTs contained in the dispersion solution to the SAM using the plurality of pores formed between the colloid particles by applying an electric field between the first conductive substrate and the second conductive substrate; and
    removing the dispersion solution with a solvent.

7. The method of claim 6, wherein an anode voltage and a cathode voltage are respectively supplied to the first conductive substrate and the second conductive substrate to produce the electric field.

8. A method of vertically aligning a Carbon NanoTube (CNT) structure including: a substrate; a CNT support layer stacked on the substrate and having a plurality of pores arranged therein; and a plurality of CNTs, one end of each of the CNTs being attached to portions of the substrate exposed through the plurality of pores and lateral sides of each of the CNTs being supported by the CNT support layer, the method comorising:
    forming the substrate as an electrically conducive substrate;
    forming a Self-Assembled Monolayer (SAM) including a functional group having a chemical affinity for the plurality of CNTs on the surface of the substrate after formation of the substrate;
    stacking the CNT support layer stacked on the substrate; and
    attaching one end of each of the CNTs to portions of the substrate exposed through the plurality of pores.

9. A method of vertically aligning a Carbon NanoTube (CNT) structure including: a substrate; a CNT support layer stacked on the substrate and having a plurality of pores arranged therein; and a plurality of CNTs, one end of each of the CNTs being attached to portions of the substrate exposed through the plurality of pores and lateral sides of each of the CNTs being supported by the CNT support layer, the method comprising attaching one end of each of the CNTs by:
    forming the substrate as a first electrically conductive substrate;
    forming a Self-Assembled Monolayer (SAM) including a functional group having a chemical affinity for the plurality of CNTs on the surface of the first electrically conductive substrate after formation of the first electrically conductive substrate;
    arranging a second electrically conductive substrate spaced a predetermined distance from a surface of the first electrically conductive substrate on which a colloid monolayer has been formed;

injecting a dispersion solution to disperse the CNTs between the first and second electrically conductive substrates;

attaching one end of each of the CNTs contained in the dispersion solution to the SAM using the plurality of pores formed between the colloid particles by applying an electric field between the first electrically conductive substrate and the second electrically conductive substrate; and removing the dispersion solution with a solvent.

10. A method of vertically aligning a Carbon NanoTube (CNT) structure including: a substrate; a CNT support layer stacked on the substrate and having a plurality of pores arranged therein; and a plurality of CNTs, one end of each of the CNTs being attached to portions of the substrate exposed through the plurality of pores and lateral sides of each of the CNTs being supported by the CNT support layer, the method comprising:

forming a Self-Assembled Monolayer (SAM) from an organic material comprising comprises 2-carboxyethyl phosphoric acid having a chemical affinity for the plurality of CNTs on the surface of the first conductive substrate after its formation;

wherein stacking of the CNT support layer comprises forming a colloid monolayer including a plurality of self-assembled colloid particles on the SAM, and forming the plurality of pores between the colloid particles; and wherein the colloid particles are formed of either silica or polystyrene.

* * * * *